United States Patent
Jeon et al.

(10) Patent No.: US 8,625,359 B2
(45) Date of Patent: Jan. 7, 2014

(54) PROGRAMMING METHOD OF FLASH MEMORY DEVICE

(75) Inventors: Yoo Nam Jeon, Seongnam-si (KR); Keon Soo Shim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 765 days.

(21) Appl. No.: 12/016,805

(22) Filed: Jan. 18, 2008

(65) Prior Publication Data

US 2009/0067242 A1 Mar. 12, 2009

(30) Foreign Application Priority Data

Sep. 10, 2007 (KR) .................. 10-2007-0091541

(51) Int. Cl.
- G11C 16/06 (2006.01)
- G11C 16/08 (2006.01)
- G11C 16/10 (2006.01)
- G11C 16/12 (2006.01)

(52) U.S. Cl.
USPC ............ 365/185.24; 365/185.18; 365/185.17; 365/185.02; 365/185.25; 365/185.28

(58) Field of Classification Search
USPC ............ 365/185.18, 185.17, 185.24, 185.02, 365/185.25, 185.28
See application file for complete search history.

(56) References Cited

U.S. PATENT DOCUMENTS

| | | | | |
|---|---|---|---|---|
| 5,621,684 A | * | 4/1997 | Jung | 365/185.17 |
| 5,715,194 A | * | 2/1998 | Hu | 365/185.17 |
| 6,061,270 A | * | 5/2000 | Choi | 365/185.02 |
| 6,614,688 B2 | * | 9/2003 | Jeong et al. | 365/185.18 |
| 2002/0118569 A1 | * | 8/2002 | Jeong et al. | 365/185.18 |
| 2004/0080980 A1 | * | 4/2004 | Lee | 365/185.17 |
| 2005/0226055 A1 | * | 10/2005 | Guterman | 365/185.28 |

FOREIGN PATENT DOCUMENTS

| | | |
|---|---|---|
| JP | 2005025898 A | 1/2005 |
| KR | 1020000044591 A | 7/2000 |
| KR | 10-0297602 B1 | 5/2001 |
| KR | 1020010082527 A | 8/2001 |
| KR | 1020050094569 A | 9/2005 |
| KR | 1020060064152 A | 6/2006 |
| KR | 1020060096243 | 10/2007 |

* cited by examiner

*Primary Examiner* — J. H. Hur
(74) *Attorney, Agent, or Firm* — Kilpatrick Townsend & Stockton LLP

(57) ABSTRACT

A memory device comprises a drain select line, a source select line, word lines, and a string connected between a bit line and a common source line. A program-inhibited voltage is applied to the bit line and a first voltage of a positive potential is applied to the drain select line. A second voltage for activating a programmed memory cell is applied to a word line to which the programmed memory cell is connected. A programming operation is performed by applying a program voltage to a selected word line and applying a pass voltage to the unselected word lines.

26 Claims, 3 Drawing Sheets

PROGRAMMING METHOD OF FLASH MEMORY DEVICE

CROSS-REFERENCES TO RELATED APPLICATIONS

The present application claims priority to Korean patent application number 10-2007-091541, filed on Sep. 10, 2007, which is incorporated by reference in its entirety.

BACKGROUND OF THE INVENTION

The present invention relates to a programming method of a flash memory device and, more particularly, to a programming method of a flash memory device, in which 2-bits or more of data are stored in one memory cell.

A flash memory device may be a NOR and a NAND type device. The NAND flash memory device is advantageous because it supports a higher level of integration than that of the NOR flash memory device. A memory cell array of a NAND flash memory device includes a plurality of memory cell blocks. This is described in more detail below.

FIG. 1 is a circuit diagram illustrating a memory cell block of a NAND flash memory device.

Referring to FIG. 1, a memory cell block includes a plurality of cell strings ST. The cell strings are connected to bit lines BL1 to BL3 (only three bit lines are illustrated to simplify description).

Each cell string has a structure in which a drain select transistor DST, a plurality of memory cells C0-1 to Cn and a source select transistor SST are connected in series. A drain of the drain select transistor DST included in each cell string is connected to a corresponding bit line and a source of the source select transistor SST is connected to a common source line CSL. Gates of the drain select transistors DST included in the respective cell strings are interconnected to form a drain select line DSL, and gates of the source select transistors SST are interconnected to form a source select line SSL. Gates of memory cells are interconnected to form word lines WL0 to WLn.

To store data in the flash memory cell described above, a programming operation is performed. During the programming operation, a high program voltage of 15V or higher is applied to a selected word line (for example, WL0), and a pass voltage is applied to the unselected word lines irrespective of an erase state or a program state so that the memory cell is activated. Bit lines are applied with a ground voltage 0V.

During the programming operation, a memory cell of a plurality of memory cells C0-1 to C0-3 that share the word line WL0 is in an erase state (hereinafter, referred to as a "program-inhibited cell"). A program-inhibited voltage (for example, Vcc) is applied to a bit line BL2 connected to a string ST including a program-inhibited cell (for example, C0-2) that is in the erase state as described above. A channel region of the program-inhibited cell C0-2 is precharged to the program-inhibited voltage. If a program voltage is applied to a word line, the voltage of a channel region is raised by channel boosting, such that a programming operation is not performed.

A programming method of storing 2-bit data in one memory cell has recently been developed. Before a programming operation is performed, an erase operation of a memory cell block is performed, so that the memory cells are in an erase state. In general, all of the memory cells store 11 data in the erase state. The programming method of storing 2-bit data is performed through several programming operations, and includes a LSB programming operation of changing the 2-bit data from 11 to 10, and a MSB programming operation of changing the 2-bit data from 11 to 01 or from 10 to 00.

Generally, after the LSB programming operation and the MSB programming operation are sequentially performed on a selected word line, they are performed on a next word line. However, during the programming operation, the threshold voltage of a memory cell connected to a word line adjacent to the selected word line can be changed due to an interference phenomenon between memory cells. To minimize the change of the threshold voltage, the sequence of the LSB programming operation and the MSB programming operation and the sequence of word lines may be changed.

If the sequence is changed as described above, a memory cell C2-2 located between the drain select transistor DST and a memory cell (for example, C1-2) connected to a selected word line, can be first programmed during a programming operation. In this case, the channel region of the memory cell C0-2 located between the source select transistor SST and the memory cell C1-2 connected to a selected word line is precharged to a low level, such that a channel voltage does not rise to a target voltage. Thus, a voltage difference between the word line WL0 and the channel region of the memory cell C0-2 is lowered, so that a programming operation of the memory cell C0-2 is performed even though the programming operation should not be performed. Consequently, the threshold voltage may rise.

BRIEF SUMMARY OF THE INVENTION

The present invention is directed towards a programming method of a flash memory device, in which a programming operation can be performed in a state where the entire channel region is precharged to the same level within a string by applying an activation voltage for activating a programmed second memory cell to a word line of the second memory cell located between a drain select transistor and a first memory cell connected to a selected word line before a program voltage is applied.

A programming method of a flash memory device according to a first embodiment of the present invention includes providing a memory device comprising a drain select line, a source select line, word lines, and a string connected between a bit line and a common source line; applying a program-inhibited voltage to the bit line; applying a first voltage of a positive potential to the drain select line; applying a second voltage for activating a programmed memory cell to a word line to which the programmed memory cell is connected; and performing a programming operation by applying a program voltage to a selected word line and applying a pass voltage to the unselected word lines.

A programming method of a flash memory device according to a second embodiment of the present invention includes providing a memory device comprising a drain select line, a source select line, word lines, and strings connected between bit lines and a common source line; applying a ground voltage to a first bit line connected to a first string including a memory cell to be programmed; applying a program-inhibited voltage to a second bit line connected to a second string including a program-inhibited cell; applying a first voltage of a positive potential to the drain select line; applying a second voltage for activating a programmed memory cell to a word line to which the programmed memory cell is connected; and performing a programming operation by applying a program voltage to a selected word line and applying a pass voltage to the unselected word lines.

A level of the first voltage may be substantially identical to that of the program-inhibited voltage.

The word line to which the programmed memory cell is connected may be located between the selected word line and the drain select line. The word line to which the programmed memory cell is connected may be adjacent to the selected word line and between the selected word line and the drain select line.

A programmed memory cell sharing a word line located between the selected word line and the drain select line may be activated by the second voltage. A programmed memory cell sharing a word line adjacent to the selected word line and between the selected word line and the drain select line may be activated by the second voltage.

Before the programming operation is performed, the supply of the second voltage may be removed.

A programming method of a flash memory device according to a third embodiment of the present invention includes providing a memory device comprising a drain select line, a source select line, word lines, and a string connected between a bit line and a common source line; precharging a channel region corresponding to the string, to precharge up to a channel region below a selected word line; activating a programmed memory cell; and performing a programming operation by applying a program voltage to the selected word line and applying a pass voltage to the unselected word lines.

A programming method of a flash memory device according to a fourth embodiment of the present invention includes providing a memory device comprising a drain select line, a source select line, word lines, and strings connected between bit lines and a common source line; applying a ground voltage to a channel region corresponding to a first string including a to-be-programmed memory cell of memory cells respectively connected to the word lines; precharging a channel region corresponding to a second string including a program-inhibited cell, to precharge up to a channel region below a selected word line in the second string; activating programmed memory cells; and performing a programming operation by applying a program voltage to the selected word line and applying a pass voltage to the unselected word lines.

The channel region may be precharged to a program-inhibited voltage applied through the bit line.

The programmed memory cell may be located between a memory cell connected to the selected word line and a drain select transistor connected to the drain select line. The programmed memory cell may be located proximate a memory cell connected to the selected word line and the drain select line. A programmed memory cell sharing a word line located between the selected word line and the drain select line may be activated. A programmed memory cell sharing a word line adjacent to the selected word line towards the drain select line may be activated.

The programmed memory cell may be activated until the programming operation is performed.

A programming method of a flash memory device according to a fifth embodiment of the present invention includes providing a memory device comprising a plurality of word lines located between a drain select line and a source select line and a string connected between a bit line and a common source line; precharging a first channel region located between the drain select line and a selected word line; electrically connecting a second channel region located between the source select line and the selected word line to the first channel region to precharge the second channel region; and performing a programming operation by applying a program voltage to the selected word line of the word lines and applying a pass voltage to the unselected word lines.

A programming method of a flash memory device according to a sixth embodiment of the present invention includes providing a memory device comprising a plurality of word lines located between a drain select line and a source select line and strings connected between bit lines and a common source line; applying a ground voltage to a channel region corresponding to a first string, including a to-be-programmed memory cell of memory cells connected to the word lines; precharging a first channel region located between the drain select line and a selected word line in a second string; electrically connecting a second channel region located between the source select line and the selected word line to the first channel region in the second string to precharge the second channel region; and performing a programming operation by applying a program voltage to the selected word line and applying a pass voltage to the unselected word lines.

The first and second channel regions may be precharged to a program-inhibited voltage applied to the bit line. Programmed memory cells may be activated to electrically connect the second channel region to the first channel region. The programmed memory cell may be connected to a word line located between the selected word line and the drain select line. The programmed memory cells may be connected to the selected word lines and a word line located between the selected word lines and the drain select line. A programmed memory cell sharing a word line located between the selected word line and the drain select line may be activated. A programmed memory cell sharing a word line adjacent to the selected word line and between the selected word line and the drain select line may be activated.

The first and second channel regions may be electrically connected until the programming operation is performed.

When performing the programming operation, the pass voltage may be applied to the unselected word lines and the program voltage may be applied to the selected word line.

According to the present invention, although the sequence of the LSB programming operation and the MSB programming operation and the sequence of word lines that are programmed are changed, a programming operation (in particular, the MSB programming operation) can be performed in a state where the channel region is precharged to the same level within a string. Accordingly, a phenomenon can be prevented in which a channel region of third memory cells located between a source select transistor and a first memory cell on which the programming operation is performed within the same string is precharged to a low voltage level. Consequently, the voltage difference between a word line and a channel region of the third memory cells can be maintained at a low level. Accordingly, the third memory cell can be prevented from being programmed when a programming operation of the third memory cell should not be performed.

DESCRIPTION OF SPECIFIC EMBODIMENTS

Embodiments according to the present invention will be described with reference to the accompanying drawings.

The present invention is not limited to the disclosed embodiments, but may be implemented in various manners. The embodiments are provided to complete the disclosure of the present invention and to allow those having ordinary skill in the art to understand the scope of the present invention. The present invention is defined by the scope of the claims.

Figure 1:
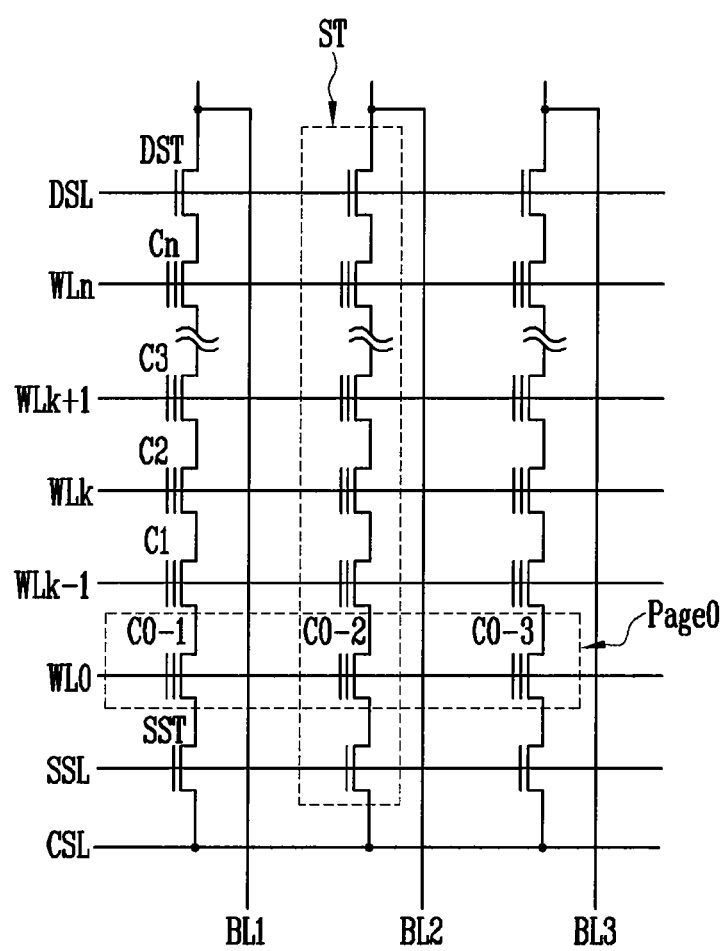
FIG. 1 is a circuit diagram illustrating a memory cell block of a NAND flash memory device.
Figure 2:
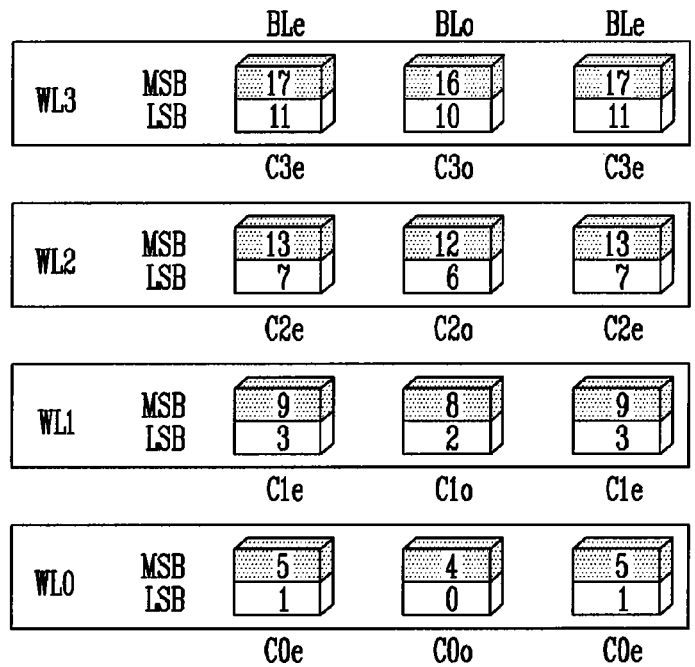
FIG. 2 is a schematic view illustrating a programming method of a flash memory device according to an embodiment of the present invention.

FIG. 2 is a schematic view illustrating a programming method of a flash memory device according to an embodiment of the present invention. Numbers indicated within the squares designate the sequence of the LSB programming operation and the MSB programming operation.

Referring to FIG. 2, in the programming method according to an embodiment of the present invention, in order to store 2-bit data in one memory cell, the LSB programming operation and the MSB programming operation are executed at every memory cell. It is to be noted that the LSB programming operation or the MSB programming operation may be performed, or a programming operation may not be performed depending on data stored in a memory cell. For example, in the event that 11 data is stored in a memory cell (that is, when the memory cell is in the erase state), a programming operation is not performed. On the other hand, when 10 data, 00 data or 01 data is stored in a memory cell, the LSB programming operation or the MSB programming operation may be performed, or both the programming operations may be performed. Hereinafter, for convenience of description, an example in which both the LSB programming operation and the MSB programming operation are executed is described. The following programming operation describes a programming method in which the threshold voltage of surrounding memory cells, which is changed due to an interference phenomenon, can be minimized when a memory cell is programmed.

The LSB programming operation is first performed on memory cells C0o, which are electrically connected to odd bit lines BLo while sharing a first word line WL0. The LSB programming operation is then performed on memory cells C0e, which are electrically connected to even bit lines BLe while sharing the first word line WL0. Thereafter, the LSB programming operation is performed on memory cells C1o, which are electrically connected to the odd bit lines BLo while sharing a second word line WL1. The LSB programming operation is then performed on memory cells C1e, which are electrically connected to the even bit lines BLe while sharing the second word line WL1.

After the LSB programming operation is performed on the memory cells sharing the first and second word lines WL0 and WL1 as described above, the LSB programming operation and the MSB programming operation are performed according to the following rule. After the LSB programming operation is performed on memory cells sharing a word line WLk (where k is an integer), the MSB programming operation is performed on memory cells sharing a word line WLk−1.

After the LSB programming operation is performed on memory cells sharing a word line WLk+1, the MSB programming operation is performed on memory cells sharing the word line WLk. Thus, the LSB programming operation and the MSB programming operation of memory cells sharing the word line WLk are completed. In a similar way, the LSB programming operation and the MSB programming operation are completed up to the last word line WLn.

If the programming operation is performed using the above method, the following phenomenon may occur in a string including program-inhibited cells.

Figure 3:
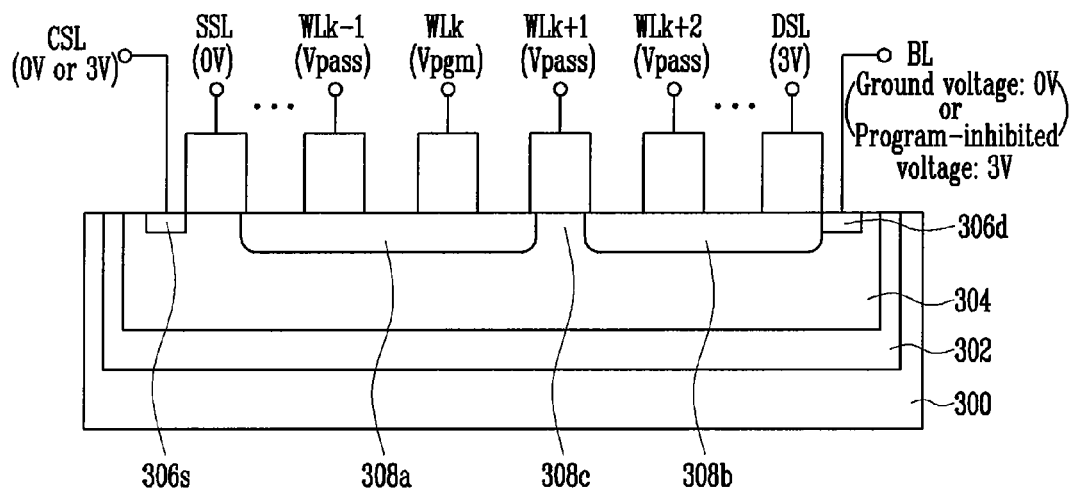
FIG. 3 is a sectional view of a string structure illustrating a channel boosting phenomenon during a programming operation.
Figure 4:
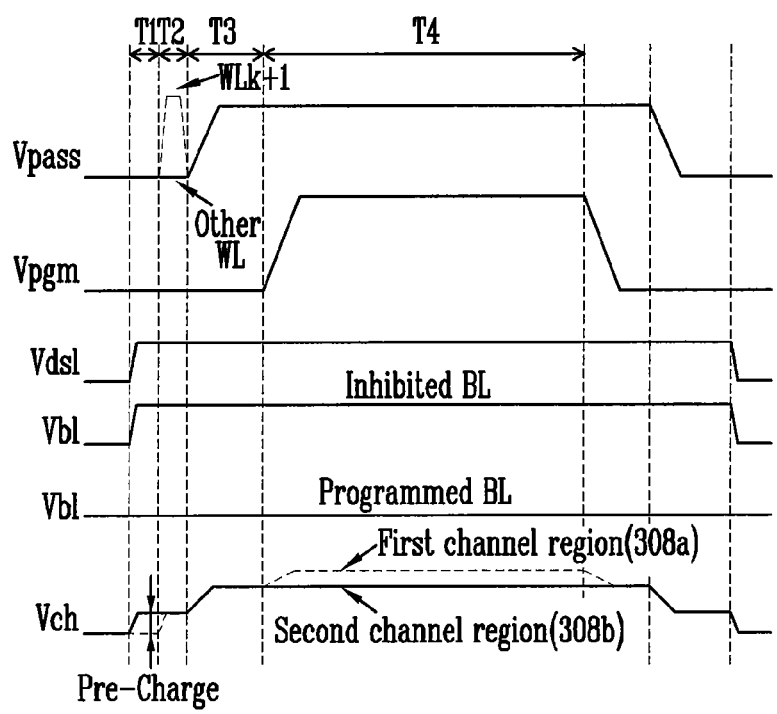
FIG. 4 is a graph illustrating an operation voltage applied during a programming operation.

FIG. 3 is a sectional view of a string structure for illustrating the channel boosting phenomenon during a programming operation. FIG. 4 is a graph illustrating the operation voltage applied during a programming operation.

Referring to FIG. 3, an N well 302 is formed in a cell region of a semiconductor substrate 300 and a P well 304 is formed in the N well 302. A plurality of word lines WLk−1 to WLk+2, where k is an integer (only four word lines are shown to simplify description), and select lines DSL and SSL, which intersect an isolation layer (not shown), are formed on the P well 304.

In the event that memory cells sharing a selected word line (for example, WLk) are programmed, a program voltage Vpgm is applied to the selected word line WLk and a pass voltage Vpass is applied to the unselected word lines WLk−1, WLk+1 and WLk+2 (only three word lines are shown to simplify description). A voltage (for example, 3V) for activating the drain select transistor is applied to the drain select line DSL, and a ground voltage (for example, 0V) is applied to the source select line SSL. A ground voltage or a positive voltage (for example, 3V) is applied to a common source line CSL connected to a source 306s of a string. When memory cells sharing the selected word line WLk within the string, on which programming should not be performed, include program-inhibited cells, a program-inhibited voltage (for example, 3V) is applied to a bit line BL. The program-inhibited voltage is transferred to a second channel region 308b through a drain 306d of the string and is thus precharged to the second channel region 308b within the string. As the second channel region 308b is precharged, the drain select transistor is deactivated due to the voltage difference between the gate and source of the drain select transistor.

During the process of performing the LSB programming operation and the MSB programming operation in order to store 2-bit data in one memory cell, the sequence of the LSB programming operation and the MSB programming operation and the sequence of programmed word lines are changed (refer to FIG. 2) to minimize a change of the threshold voltage of adjacent memory cells due to an interference phenomenon. The programming operation can be performed on memory cells sharing a word line (for example, Wlk+1) located between the word line and the drain select line DSL before the programming operation of the selected word line WLk is performed. During a precharging operation, memory cells sharing an adjacent word line Wlk+1 are deactivated, so a channel region 308c is not formed below the word line WLk+1. Thus, a first channel region 308a located between the source select line SSL and the word line Wlk+1 is isolated from the second channel region 308b located between the drain select line DSL and the word line WLk+1. In other words, the precharge voltage is not transferred to the first channel region 308a of memory cells that share the selected word line WLk and the word line WLk−1 located between the source select line SSL and the selected word line WLk.

In order to prevent program-inhibited cells that share the selected word line WLk from being programmed, the first channel region 308a is precharged, and the voltage of the first channel region 308a is raised by the program voltage Vpgm or the pass voltage Vpass due to a boosting phenomenon. However, since the first channel region 308a is isolated from the second channel region 308b during the precharging operation, only the second channel region 308b is precharged, so that a precharge level between the first and second channel regions 308a and 308b differs. Since weak channel boosting is generated in the first channel region 308a, the voltage difference between the word line WLk and the channel region 308a is increased. Further, since program-inhibited cells that share the selected word line WLk are weakly programmed, the threshold voltage is changed.

A method of preventing these problems is described below.

Referring to FIGS. 3 and 4, for a programming operation, the ground voltage or a precharge voltage (e.g. a program-inhibited voltage Vbl) is applied to the bit line BL. For example, one word line WLk can be selected according to an address signal. A plurality of memory cells are connected to the selected word line WLk and the memory cells are included in different strings. The memory cells sharing the selected word line WLk can be classified into to-be-programmed memory cells and program-inhibited cells depending on data to be stored. The ground voltage is applied to a bit line connected to a string including the to-be-programmed memory cells, and the precharge voltage Vbl is applied to a bit line connected to a string including the program-inhibited cells. A programming operation within a string structure to which the precharge voltage Vbl is applied is described below.

In a precharge period T1, the ground voltage or the precharge voltage Vbl is applied to the bit line BL. The precharge voltage Vbl of a positive potential (for example, 3V) is applied to the bit line BL and a positive voltage Vdsl (for example, 3V) for activating the drain select transistor is applied to the drain select line DSL. The ground voltage is applied to the source select line SSL and the word lines. During a programming operation, memory cells sharing the word line WLk to which the program voltage Vpgm will be applied and the word line WLk+1 located between the word line WLk and the drain select line DSL are in a program state. Since a channel is not formed in the channel region 308c below the word line WLk+1, the first and second channel regions 308a and 308b are isolated from each other, so the first channel region 308a is not precharged. Memory cells sharing the word line WLk+2 located between the word line WLk+1 and the drain select line DSL are in the erase state, so that a channel region is formed below the word line WLk+2 and the second channel region 308b is precharged.

In a charge transfer period T2, the first channel region 308a is precharged so that the voltage of the first channel region 308a has substantially the same level as that of the second channel region 308b. More specifically, a voltage sufficient to activate memory cells is applied to the word line Wlk+1 on which the programming operation has been performed. The word line WLk+1 is located between the word line WLk to which the program voltage Vpgm will be applied and the drain select line DSL. A voltage sufficient to activate memory cells may be applied to the word lines on which the programming operation has been performed including the word line WLk+1. As a channel is formed in the channel region 308c below the word line WLk+1, the first channel region 308a and the second channel region 308b are connected. Consequently, the precharge voltage Vbl applied through the bit line BL is transferred to the first channel region 308a, so that the first channel region 308a is precharged to substantially the same level as that of the second channel region 308b.

In a channel voltage boost period T3, the pass voltage Vpass is applied to the unselected word lines but not including the selected word line WLk. The pass voltage Vpass is applied in a state where the drain select transistor is deactivated because Vgs of the drain select transistor sharing the drain select line DSL is lower than the threshold voltage. If the drain select transistor is deactivated, the channel regions 308a and 308b are in the floating state. Thus, if the pass voltage Vpass is applied to the word lines, the boosting phenomenon is generated due to a capacitor coupling phenomenon, so the voltages of the channel regions 308a and 308b rise. Since the first and second channel regions 308a and 308b are precharged to substantially the same level, the voltages of the channel regions 308a and 308b rise to the same level.

In a programming period T4, the program voltage Vpgm is applied to the selected word line WLk on the first channel region 308a. Thus, the boosting phenomenon can be additionally generated in the first channel region 308a. The voltage of the first channel region 308a becomes higher than that of the second channel region 308b. Furthermore, a voltage difference between the word line WLk and the first channel region 308a is further decreased. Accordingly, a program phenomenon can be further prevented from occurring in program-inhibited cells sharing the word line WLk.

After the program voltage Vpgm is applied for a predetermined time period, the supply of the program voltage Vpgm is removed and the supply of the pass voltage Vpass is removed. The application of the voltage Vbl to the bit line and the voltage Vdsl to the drain select line DSL is removed. Accordingly, the voltages of the channel regions 308a and 308b can also be lowered.

If the programming operation is performed using the above method, a program disturbance phenomenon can be prevented.

After the programming operation is performed according to the above method, a program-verifying operation is performed. If, as a result of the program-verifying operation, memory cells have not been normally programmed, the level of the program voltage is changed and the programming operation is then performed again. This method is called a programming method of an Incremental Step Pulse Program (ISPP) method.

The present invention is not limited to the disclosed embodiment, but may be implemented in various manners. The embodiment is provided to complete the disclosure of the present invention and to allow those having ordinary skill in the art to understand the scope of the present invention. The present invention is defined by the scope of the claims.

What is claimed is:

1. A programming method of a flash memory device, including a cell string, which includes a drain select line, word lines, and a source select line, connected between a bit line and a common source line, the method comprising:
   precharging the bit line;
   applying a second voltage for activating a programmed memory cell to a word line to which the programmed memory cell is connected except a selected word line; and
   performing a programming operation by applying a program voltage to the selected word line and applying a pass voltage to unselected word lines,
   wherein the pass voltage applied to the unselected word lines rises after the second voltage drops,
   wherein the pass voltage is applied to the unselected word lines before the program voltage is applied to the selected word line.

2. The programming method of claim 1, wherein the word line to which the programmed memory cell is connected is located between the selected word line and the drain select line.

3. The programming method of claim 1, wherein the word line to which the programmed memory cell is connected is adjacent to the selected word line in the direction of the drain select line.

4. The programming method of claim 1, wherein a programmed memory cell sharing a word line located between the selected word line and the drain select line is activated by the second voltage.

5. The programming method of claim 1, wherein a programmed memory cell sharing a word line adjacent to the selected word line in the direction of the drain select line is activated by the second voltage.

6. The programming method of claim 1, further comprising:
cutting off the second voltage before said performing a programming operation is performed.

7. The programming method of claim 1, wherein the precharging the bit line comprises:
applying a ground voltage to a first bit line connected to a first string including a selected memory cell;
applying a program-inhibited voltage to a second bit line connected to a second string including a program-inhibited cell; and
applying a first voltage of a positive potential to the drain select line.

8. The programming method of claim 7, wherein the first voltage of a positive potential is substantially identical to that of the program-inhibited voltage.

9. The programming method of claim 7, wherein the program-inhibited voltage is a power supply voltage.

10. A programming method of a flash memory device, including a string, which includes a drain select line, word lines, and a source select line, connected between a bit line and a common source line, the method comprising:
precharging a channel region corresponding to the string;
activating a programmed memory cell except a memory cell of a selected word line to precharge up to a channel region below the selected word line; and
performing a programming operation by applying a program voltage to the selected word line and applying a pass voltage to unselected word lines,
wherein the programmed memory cell is activated by a second voltage and the pass voltage applied to the unselected word lines rises after the second voltage drops,
wherein the pass voltage is applied to the unselected word lines before the program voltage is applied to the selected word line.

11. The programming method of claim 10, wherein the programmed memory cell is located between the selected word line and the drain select line.

12. The programming method of claim 10, wherein the programmed memory cell is adjacent to the selected word line in the direction of the drain select line.

13. The programming method of claim 10, wherein a programmed memory cell sharing a word line located between the selected word line and the drain select line is activated.

14. The programming method of claim 10, wherein a programmed memory cell sharing a word line adjacent to the selected word line in the direction of the drain select line is activated.

15. The programming method of claim 10, wherein the precharging a channel region comprises:
applying a ground voltage to the channel region of a first bit line corresponding to a first string including a selected memory cell;
applying a program-inhibited voltage to a second channel region of a second bit line corresponding to a second string including a program-inhibited cell; and
applying a first voltage of a positive potential to the drain select line.

16. The programming method of claim 15, wherein the first voltage of a positive potential is substantially identical to that of the program-inhibited voltage.

17. The programming method of claim 15, wherein the program-inhibited voltage is a power supply voltage.

18. A programming method of a flash memory device, including a string, which includes a source select line, word lines, and a drain select line connected between a bit line and a common source line, the method comprising:
precharging a first channel region located between the drain select line and a selected word line;
electrically connecting a second channel region located between the source select line and the selected word line to the first channel region to precharge the second channel region; and
performing a programming operation by applying a program voltage to the selected word line and applying a pass voltage to unselected word lines,
wherein the second channel region is electrically connected to the first channel region before the pass voltage is applied to the unselected word lines,
wherein the pass voltage is applied to the unselected word lines before the program voltage is applied to the selected word line,
wherein the second channel region is connected to the first channel region by applying a second voltage to the word lines except the selected word line, and
wherein the pass voltage applied to the unselected word lines rises after the second voltage drops.

19. The programming method of claim 18, wherein the programmed memory cell is located between the selected word line and the drain select line.

20. The programming method of claim 18, wherein the programmed memory cell is adjacent to the selected word line in the direction of the drain select line.

21. The programming method of claim 18, wherein a programmed memory cell sharing a word line located between the selected word line and the drain select line is activated.

22. The programming method of claim 18, wherein a programmed memory cell sharing a word line adjacent to the selected word line in the direction of the drain select line is activated.

23. The programming method of claim 18, wherein the first and second channel regions are electrically connected until the programming operation is performed.

24. The programming method of claim 18, wherein the precharging a first channel region comprises:
applying a ground voltage to the channel region of a first bit line corresponding to a first string including a selected memory cell;
applying a program-inhibited voltage to a second channel region of a third bit line corresponding to a second string including a program-inhibited cell; and
applying a first voltage having positive potential to the drain select line.

25. The programming method of claim 24, wherein the first voltage having positive potential is substantially identical to that of the program-inhibited voltage.

26. The programming method of claim 24, wherein the program-inhibited voltage is a power supply voltage.

* * * * *